United States Patent
Harari et al.

[11] Patent Number: 6,151,248
[45] Date of Patent: Nov. 21, 2000

[54] DUAL FLOATING GATE EEPROM CELL ARRAY WITH STEERING GATES SHARED BY ADJACENT CELLS

[75] Inventors: Eliyahou Harari, Los Gatos; Daniel C. Guterman, Fremont; George Samachisa, San Jose; Jack H. Yuan, Cupertino, all of Calif.

[73] Assignee: SanDisk Corporation, Sunnyvale, Calif.

[21] Appl. No.: 09/343,328

[22] Filed: Jun. 30, 1999

[51] Int. Cl.[7] ............................................. G11C 16/04
[52] U.S. Cl. ......................... 365/185.14; 365/185.18; 365/185.01; 257/315
[58] Field of Search .................. 365/185.18, 185.14, 365/185.29, 185.01; 257/315

[56] References Cited

U.S. PATENT DOCUMENTS

| | | |
|---|---|---|
| 4,336,603 | 6/1982 | Kotecha et al. . |
| 4,380,057 | 4/1983 | Kotecha et al. . |
| 4,417,264 | 11/1983 | Angle . |
| 4,855,955 | 8/1989 | Cioaca . |
| 5,021,999 | 6/1991 | Kohda et al. . |
| 5,043,940 | 8/1991 | Harari . |
| 5,070,032 | 12/1991 | Yuan et al. . |
| 5,095,344 | 3/1992 | Harari . |

(List continued on next page.)

FOREIGN PATENT DOCUMENTS

| | | |
|---|---|---|
| 0051158 | 10/1981 | European Pat. Off. . |
| 55-043862 | 3/1980 | Japan . |
| 58-222561 | 12/1983 | Japan . |
| 7226449 | 8/1995 | Japan . |
| WO 95/19047 | 7/1995 | WIPO . |

OTHER PUBLICATIONS

Alberts et al., "Multi–Bit Storage FET EAROM Cell", IBM Technical Disclosure Bulletin, vol. 24, No. 7A, Dec. 1981, pp. 3311–3314.

Kamiya et al., "EPROM Cell with igh Gate Injection Efficiency", Int'l Electron Device Mtg., Technical Digest, Dec. 13, 1982, pp. 741–744.

Ma et al., "A Dual–bit Split–Gate EEPROM (DSG) Cell in Contactless Array for Single–Vcc High Density Flash Memories", 1994 IEEE pp. 3.5.1 thru 3.5.4.

Pein et al, "Performance of the #–D Sidewall Flash EPROM Cell", International Electron Devices Meeting Technical Digest, Washington DC, Dec. 5–8, 1993, pp. 2.1.1 thru 2.1.4.

Kuo et al., "TEFET—A High Density, Low Erase Voltage, Trench Flash EEPROM", 1994 Symposium on VLSI Technology, Honolulu, Jun. 7–9, 1994, pp. 51–52.

*Primary Examiner*—Huan Hoang
*Attorney, Agent, or Firm*—Majestic, Parsons, Siebert & Hsue

[57] ABSTRACT

An EEPROM system having an array of memory cells that individually include two floating gates, bit line source and drain diffusions extending along columns, steering gates also extending along columns and select gates forming word lines along rows of floating gates. The dual gate cell increases the density of data that can be stored. Rather than providing a separate steering gate for each column of floating gates, an individual steering gate is shared by two adjacent columns of floating gates that have a diffusion between them. The steering gate is thus shared by two floating gates of different but adjacent memory cells. In one array embodiment, the floating gates are formed on the surface of the substrate, where the added width of the steering gates makes them easier to form, removes them as a limitation upon scaling the array smaller, require fewer electrical contacts along their length because of increased conductance, are easier to contact, and reduces the number of conductive traces that are needed to connect with them. In arrays that erase the floating gates to the select gates, rather than to the substrate, the wider steering gates advantageously uncouple the diffusions they cover from the select gates. This use of a single steering gate for two floating gates also allows the floating gates, in another embodiment, to be formed on side walls of trenches in the substrate with the common steering gate between them, to further increase the density of data that can be stored. Multiple bits of data can also be stored on each floating gate.

31 Claims, 6 Drawing Sheets

U.S. PATENT DOCUMENTS

| | | |
|---|---|---|
| 5,095,461 | 3/1992 | Miyakawa et al. ............ 365/185.14 |
| 5,159,570 | 10/1992 | Mitchell et al. . |
| 5,172,338 | 12/1992 | Mehrotra et al. . |
| 5,210,047 | 5/1993 | Woo et al. . |
| 5,278,439 | 1/1994 | Ma et al. . |
| 5,297,148 | 3/1994 | Harari et al. . |
| 5,313,421 | 5/1994 | Guterman et al. . |
| 5,315,541 | 5/1994 | Harari et al. . |
| 5,343,063 | 8/1994 | Yuan et al. . |
| 5,364,806 | 11/1994 | Ma et al. . |
| 5,411,905 | 5/1995 | Acovic et al. . |
| 5,412,600 | 5/1995 | Nakajima . |
| 5,414,693 | 5/1995 | Ma et al. . |
| 5,486,714 | 1/1996 | Hong . |
| 5,576,567 | 11/1996 | Mori . |
| 5,606,521 | 2/1997 | Kuo et al. . |
| 5,616,510 | 4/1997 | Wong . |
| 5,636,160 | 6/1997 | Omino et al. ............ 365/185.18 |
| 5,643,814 | 7/1997 | Chung . |
| 5,661,053 | 8/1997 | Yuan . |
| 5,712,180 | 1/1998 | Guterman et al. . |
| 5,714,412 | 2/1998 | Liang et al. . |
| 5,786,612 | 7/1998 | Otani et al. . |
| 5,812,449 | 9/1998 | Song . |
| 5,991,201 | 11/1999 | Chang ............ 365/185.29 |
| B1 5,172,338 | 7/1997 | Mehrotra et al. . |

EXAMPLE MEMORY CELL OPERATING VOLTAGES

| FUNCTION BEING PERFORMED ON CELL | SELECT GATE (WORD LINE) | LEFT BIT LINE (BL-LEFT) | LEFT STEERING GATE | RIGHT STEERING GATE | RIGHT BIT LINE (BL-RIGHT) |
|---|---|---|---|---|---|
| (1) UNSELECTED ROW | 0 | X | X | X | X |
| (2) ERASE (TO WORD LINE) | $V_E$ | 5 | 0 | 0 | 5 |
| (3) READ LEFT FLOATING GATE | $V_{SR}$ | 0 | $V_M$ | $V_{BR}$ | 1 |
| (4) READ RIGHT FLOATING GATE | $V_{SR}$ | 1 | $V_{BR}$ | $V_M$ | 0 |
| (5) PROGRAM LEFT FLOATING GATE | $V_{SP}$ | 5 | $V_P$ | $V_{BP}$ | 0 |
| (6) PROGRAM RIGHT FLOATING GATE | $V_{SP}$ | 0 | $V_{BP}$ | $V_P$ | 5 |
| (7) NO PROGRAM IN SELECTED ROW | $V_{SP}$ | 5 | X | X | 5 |
| (8) ERASE (TO CHANNEL) [WITH VOLTAGES OF BOTH THE p-well AND n-well EQUAL TO $V_E$, AND THE SUBSTRATE AT ZERO VOLTS] | $V_{SE}$ | FLOAT | 0 | 0 | FLOAT |

DUAL FLOATING GATE EEPROM CELL ARRAY WITH STEERING GATES SHARED BY ADJACENT CELLS

CROSS-REFERENCE TO RELATED APPLICATION

This is related to another application Ser. No. 09/343,493 by Eliyahou Harari, Jack H. Yuan and George Samachisa, entitled "Processing Techniques for Making a Dual Floating Gate EEPROM Cell Array," filed concurrently with the present application, which other application is incorporated herein in its entirety by this reference.

BACKGROUND OF THE INVENTION

This invention relates generally to flash EEPROM (Electrically Erasable and Programmable Read Only Memory) systems, and, more specifically, to memory arrays of flash EEPROM cells that individually contain two floating gates and to systems that utilize them.

There are many commercially successful non-volatile memory products being used today, particularly in the form of small cards, which use a flash EEPROM array of cells having a "split-channel" between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in copending United States patent application Ser. No. 09/239,073, filed Jan. 27, 1999, which patents and application are incorporated herein by this reference.

A modification of this split-channel flash EEPROM cell adds a steering gate positioned between the floating gate and the word line. Each steering gate of an array extends over one column of floating gates, perpendicular to the word line. The effect is relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described in U.S. Pat. No. 5,313,421, which patent is incorporated herein by this reference.

In either of the two types of memory cell arrays described above, the floating gate of a cell is programmed by injecting electrons from the substrate to the floating gate. This is accomplished by having the proper doping in the channel region and applying the proper voltages to the source, drain and remaining gate(s). So called "source side" injection is preferred, being described in the foregoing U.S. Pat. No. 5,313,421.

Two techniques of removing charge from floating gates to erase memory cells are used in both of the two types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sector's worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Therefore, in order to further increase data storage density, a flash EEPROM system using a dual floating gate memory cell is being utilized along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. This cell array architecture and operating techniques are described in U.S. Pat. No. 5,712,180 and copending application Ser. No. 08/910,947, filed Aug. 7, 1997, which patent and application are incorporated herein by this reference.

Therefore, it is among primary objects of the present invention to provide a dual floating gate memory cell array that permits increased density data storage and the downward scaling of its size.

It is another object of the present invention to provide improved operating techniques for memory systems including flash EEPROM cell arrays, including those of the dual floating gate type.

It is a further object of the present invention to provide improved processing techniques for forming flash EEPROM cell arrays, including those of the dual floating gate type.

SUMMARY OF THE INVENTION

These and additional objects are accomplished by the present invention, wherein, briefly and generally, according to one aspect, an array of dual floating gate flash EEPROM cells have steering gates with widths that extend over and are capacitively coupled with two adjacent floating gates of adjacent memory cells in a row. This reduces the number of steering gates by one-half and, in an embodiment where the floating gates are formed on the surface of the substrate, increases their individual widths by more than twice since they also extend over a source or drain diffusion that is positioned between the adjacent cells. The wider steering gate allows it to be formed more easily, need not be the minimum resolvable feature size, provides an increased level of conduction along its length, thus, when made of polysilicon material, reducing the number of contacts that must be made to it from metal conductors, and the making of those contacts becomes easier.

According to another aspect of the present invention, floating gates are positioned along walls of trenches formed in the surface of the substrate, source and drain diffusions are provided at the bottom of the trenches, and the select transistor between the two floating gates of individual cells is formed on the surface of the substrate. The steering gate common to the floating gates in a particular trench is formed between them in the same trench, thus being oriented in cross-section in a direction that is orthogonal to the surface of the substrate. This structure has the added advantage of further reducing the area of the substrate taken by a single cell. The ability to share the steering gate between adjacent floating gates of two memory cells on opposite sides of a source or drain diffusion makes this trench configuration practical.

Additional objects, advantages and features of the present invention are included in the following description of its preferred embodiments, which description should be taken in conjunction with the accompany drawings. Specifically, improved techniques of forming and of operating flash EEPROM cell arrays and systems are included as part of the present invention, as applied to the dual gate memory cell embodiments specifically described herein and more generally to other dual gate cell structures and memory arrays having other than the dual gate cell configuration.

DESCRIPTION OF THE PREFERRED EMBODIMENTS

Figure 1:
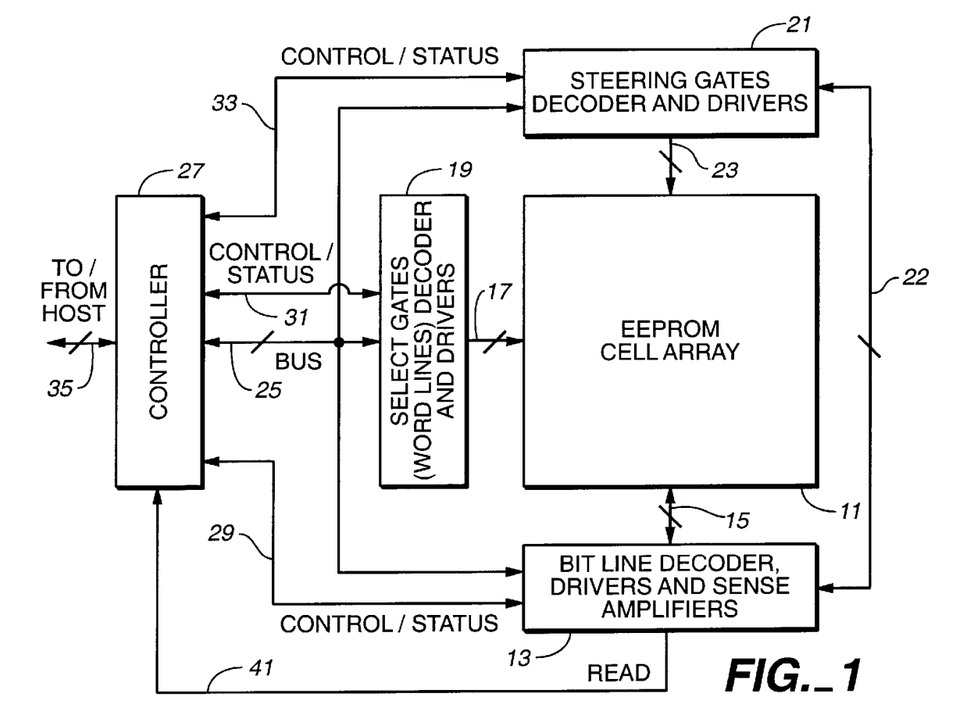
FIG. 1 illustrates in block diagram form a flash EEPROM system utilizing the present invention.

An example memory system incorporating the various aspects of the present invention is generally illustrated in the block diagram of FIG. 1. A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the CompactFlash™ Association, the MMC™ Association, and others. When in a card format, the lines 35 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 1 are permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of sense amplifiers are usually used in order to be able to read the states of a large number of memory cells in parallel. During reading and program operations, one row of cells is typically addressed at a time through the circuits 19 for accessing a number of cells in the addressed row that are selected by the circuits 13 and 21. During an erase operation, all cells in each of many rows are typically addressed together as a block for simultaneous erasure.

Two structural embodiments of the memory cell array 11 are shown in FIGS. 2—7, where the substrate and conductive elements are illustrated with little detail of dielectric layers that exist therebetween. This simplifies the Figures but it will be understood that appropriate oxide layers, those both grown and deposited, deposited silicon nitride layers, and other dielectrics commonly used are to be included between the conductive layers themselves and the conductive layers and the substrate.

First Memory Cell Array Embodiment

Figure 2:
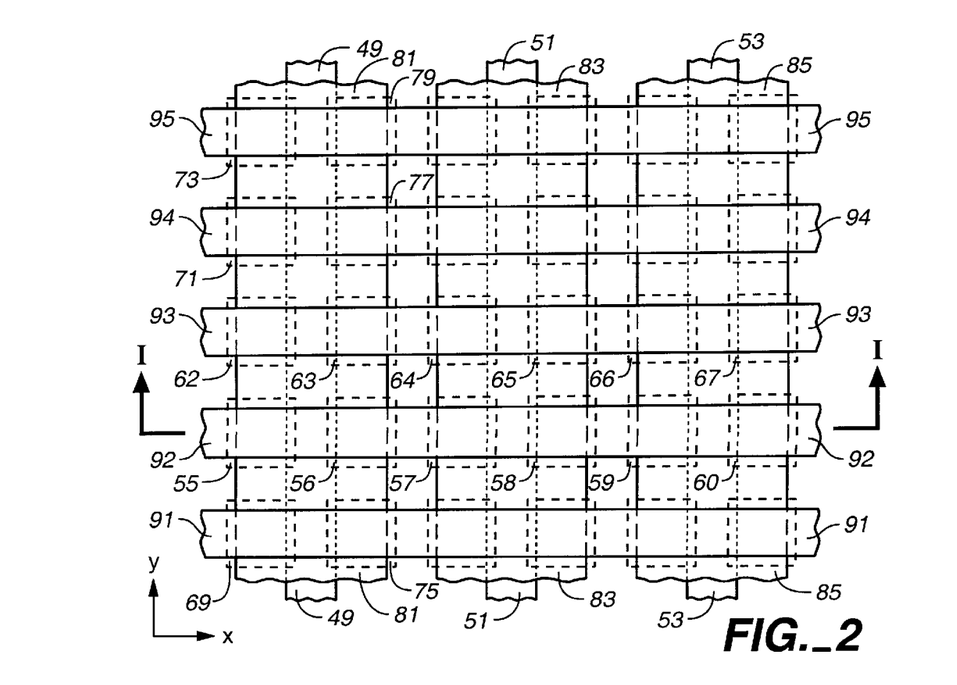
FIG. 2 is a plan view of a first embodiment of a memory cell array of the present invention.
Figure 3:
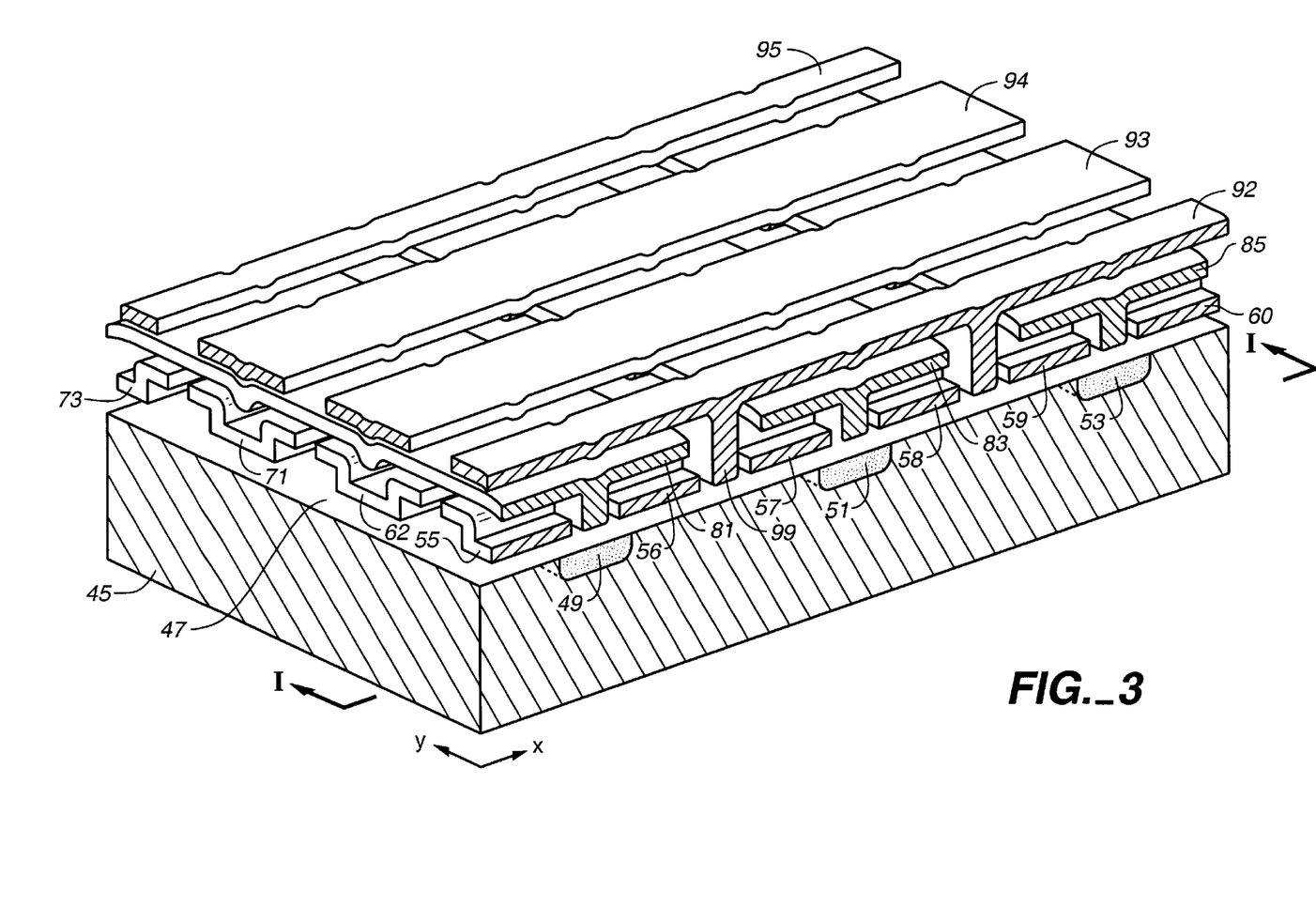
FIG. 3 is an isometric view of the memory cell array of FIG. 2.
Figure 4:
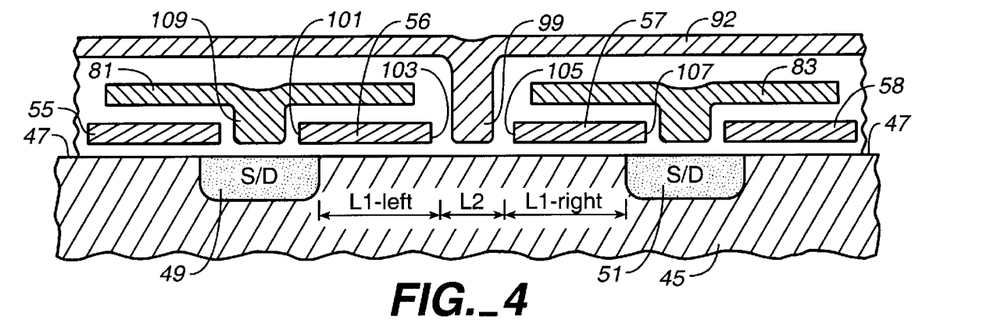
FIG. 4 is a cross-sectional view of the memory cell array of FIGS. 2 and 3, taken at section I—I thereof.

The first array embodiment is illustrated in FIGS. 2–4, where a small part of its repetitive structure is included. A usual silicon substrate 45 includes a planar top surface 47. Elongated diffusions 49, 51 and 53 are formed into the substrate 45 through the surface 47 by an initial ion implantation and subsequent diffusion, and serve as sources and drains of the memory cells formed between them. In order to provide a convention for this description, the diffusions are shown to be spaced apart in a first "x" direction, with lengths extending in a second "y" direction, these first and second directions being essentially orthogonal with each other. A large number of floating gates are included across the substrate surface 47 with suitable gate dielectric therebetween, in an array of rows and columns. One row of floating gates 55–60 is adjacent to and parallel with another row of floating gates 62–67, for example, and a column of floating gates 69, 55, 62, 71 and 73 is adjacent to and parallel with a column of floating gates 75, 56, 63, 77 and 79. The floating gates are formed from a first layer of conductively doped polycrystalline silicon ("polysilicon") that is deposited over the entire surface and then separated, by etching through a mask, into the individual floating gates.

The bit line decoder and driver circuit 13 (FIG. 1) is connected through lines 15 with all of the bit line source/drain diffusions of the array, including the diffusions 49, 51 and 53 of FIGS. 2–4. The sources and drains of columns of individual memory cells are connected to proper programming voltages for either reading or programming in response to addresses supplied over the bus 25 and control signals over the lines 19.

Rather than employing a separate steering gate for each column of floating gates, the structure of FIGS. 2–4 uses one wider steering gate for every two columns of floating gates. Steering gates 81, 83 and 85 are elongated in the y-direction and have a width in the x-direction that extends across two adjacent columns of floating gates and a source/drain diffusion that is positioned in between them. The space between any two of the steering gates is at least as great as the space in the x-direction between adjacent columns of floating gates that are overlaid by the two steering gates, in order to allow a gate to be later formed at the substrate in this space. The steering gates are formed by etching a second layer of conductively doped polysilicon that is deposited over the entire surface over the first polysilicon layer and an appropriate inter-polysilicon layer dielectric. The steering gate decoder and driver circuit 21 (FIG. 1) connects though lines 23 to all the steering gates and is able to individually control their voltages in response to addresses provided on the bus 25, control signals in the lines 33, and data from the drivers and sense amplifiers 13.

Word lines 91–95 of FIGS. 2–4 are elongated in the x-direction and extend over the steering gates with spaces between them in the y-direction that places each word line in alignment with a row of floating gates. The word lines are formed by etching a third layer of conductively doped polysilicon that is deposited over the entire surface on top of a dielectric that is first formed over the second polysilicon layer and regions exposed between the steering gates. The word lines allow selection of all the memory cells in its row for reading or writing. The select gate decoder and driver circuit 19 (FIG. 1) is connected with each word line in order to individually select one row of the cell array. Individual cells within a selected row are then enabled for reading or writing by the bit line and steering gate decoder and driver circuits 13 and 21.

Although the gates in the foregoing structure are preferably made of doped polysilicon material, other suitable electrically conductive materials may be used in place of one or more of the three polysilicon layers described. The third layer, for example, from which the word lines and select gates are formed, may be a polycide material, which is polysilicon with a conductive refractive metal silicide on its top, such as tungsten, in order to increase its conductivity. Polycides are generally not used in place of either the first or second polysilicon layers because the quality of oxide grown from a polycide is usually not satisfactory.

Not shown in FIGS. 2–4 are the metal conductor layers. Since the diffusions and polysilicon elements usually have a conductivity that is significantly less than that of metal, metal conductors are included in separate layers, with connections made to respective metal lines through any intermediate layers at periodical intervals along the lengths of the polysilicon elements and diffusions. Since all of the diffusions and polysilicon elements of the embodiment of FIGS. 2–4 need to be separately driven, there is a one-to-one correspondence between the number of these metal lines and the number of diffusions and polysilicon elements. One advantage of reducing the number of steering gates by one-half, a result of the present invention, is that the number of corresponding metal lines necessary to be connected to the steering gates is also reduced by one-half This is significant because present processing techniques are generally not able to form the metal lines with the same small pitch as diffusions and polysilicon elements. The reduction in number of metal conductors in any integrated circuit has the potential of reducing its size and complexity, to improve its operation, and increase the manufacturing yield.

There are also other advantages to extending the widths of the steering gates across two adjacent columns of floating gates, rather than providing a separate steering gate along each column of floating gates. One such advantage is that the conductivity of each steering gate is increased by more than two times, with all other parameters remaining unchanged, so that the number of contacts that must be provided along its length to a metal layer conductor is significantly reduced. Further, the additional steering gate width makes it easier to make such contacts. Another important advantage is that the steering gate width is no longer a minimum feature size of the structure, thus eliminating that constraint on the processing and making it easier to scale the size of the structure as future developments in processing allow.

With reference to the enlarged cross-sectional view of FIG. 4, other details of an exemplary dual floating gate memory cell structure are described. An electrical equivalent circuit is given in FIG. 5, where equivalent elements are identified by the same reference numbers as in FIGS. 2–4 but with a prime (') added. The illustrated cell shares the source and drain diffusions with its neighboring cells. Conduction through the cell's channel in the substrate between the adjacent diffusions 49 and 51 is controlled by different gate elements in three different regions. A first region to the left (L1-left) has the floating gate 56 immediately above it and the steering gate 81 capacitively coupled with it. A second region to the right (L1-right) is controlled in a similar manner by the floating gate 57 and the steering gate 83. A third region L2, in between the first two, is controlled by a select gate 99 that is part of the word line 92 formed from the third polysilicon layer with a gate dielectric layer between it and the substrate surface 47. Although use of n-channel semiconductor transistors is preferred, implementation of the present invention is not limited to use of such devices.

The level of conduction of electrons through the cell's channel between the diffusions 49 and 51 is thus affected by the electric fields imparted by these different gate elements to their respective channel regions by the voltages placed on the gates. The voltage on a floating gate is dependent upon the level of net electrical charge it carries plus all displacement charge that is capacitively coupled from other gates and nodes. The level of conduction that is permitted through the channel portion under a floating gate is controlled by the voltage on that floating gate. The voltage on the select gate 99 simply turns the channel on and off to any conduction in order to select individual cells for connection with their source/drain regions. An individual cell can be considered as a series connection of three transistors, one for each of the three different regions of the channel, as illustrated in the equivalent circuit of FIG. 5. The gate elements 56, 57 and 99 are the only gates that control conduction through the memory cell shown in FIG. 4, but the voltages on gates 56 and 57 are affected by the voltages on other gate, source and drain elements through capacitive coupling with them.

Another advantage of spanning two floating gate columns with a single steering gate is that the level of capacitive coupling between the floating and steering gates is increased while the coupling between the floating gate and the word line is decreased. Since the steering gate 81, for example, extends across an edge 101 of the floating gate 56 in the x-direction, that edge is shielded from coupling with the word line 92. Instead of the word line 92 extending downward between adjacent floating gates 55 and 56, as is most likely the case when the steering gate is no wider in the x-direction than the floating gate which it overlies, coupling of the word line with the floating gate edge 101 is eliminated by the steering gate extending across to the adjacent floating gate 55 and thereby providing a shield between the word line 92 and the edge 101 of the floating gate. Coupling between the floating gate 56 and the steering gate 81 is then optionally but desirably further increased by extending a portion 109 the steering gate 81 downward adjacent the floating gate edge 101. Coupling between the floating gate 56 and the word line 92 is then effectively reduced to the small area along an opposite floating gate edge 103. This significant reduction of the capacitive coupling between the floating gate and word line is very beneficial. By increasing the amount of coupling between steering and floating gates relative to the coupling of the floating gate with the substrate and the word line, less voltage need be applied to the steering gate to bring about a desired result in the memory cell's channel portion under that floating gate. A benefit that results from a reduced steering gate voltage is a reduced stress on the dielectric layer between the steering gate and the substrate, and on the dielectric layer between the steering gate and the word line, since the substrate and word line are typically operated at lower voltages than the steering gate during reading and programming operations.

One of the two floating gates of a single memory cell is selected for programming or reading by placing a voltage on the steering gate above the other floating gate of the cell that is sufficient to cause the channel region under the other floating gate become adequately conductive no matter what charge (which is related to its state) is carried by that other (non-selected) floating gate. When that cell's select transistor is turned on by a sufficient voltage applied to its word line, it is only the selected floating gate that responds to reading or programming operations directed to the cell. During reading the state of the one floating gate, current through the cell between its source and drain is then dependent upon the charge carried by the selected floating gate without regard to the charge on the other floating gate. Although the voltage placed on the steering gate over the non-selected floating gate to render the channel portion under the non-selected floating gate conductive is also coupled to an adjacent floating gate of an adjacent cell through the same steering gate, impact on the adjacent cell is avoided by placing proper voltage conditions on the other elements of the adjacent cell.

The memory cell floating gates of the embodiment of FIGS. 2–4 are preferably programmed by placing voltages on its bit lines (source and drain diffusions) and its two steering gates that cause electrons to obtain enough energy in the substrate channel region to be injected across the gate dielectric onto the selected floating gate. A preferred technique for this is "source side injection," described in the afore referenced U.S. Pat. Nos. 5,313,421 and 5,712,180.

Figure 5:
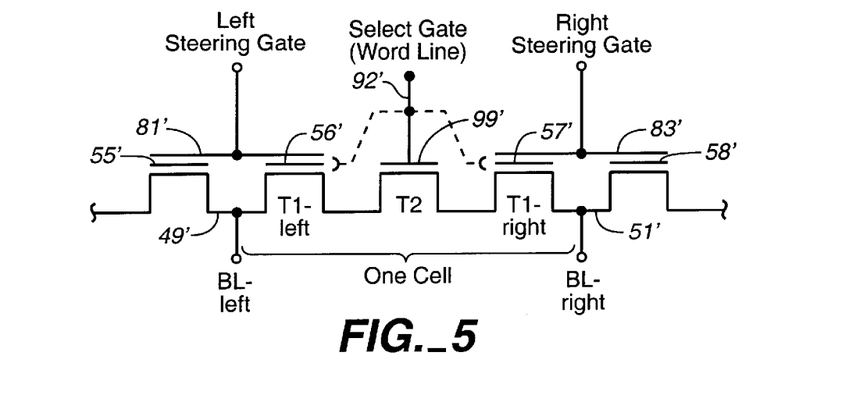
FIG. 5 is an electrical equivalent circuit of one of the memory cells of the array of FIGS. 2 and 3.

In order to erase the memory cells of the embodiment of FIGS. 2–4, they may be designed and operated so that electrons are removed from the selected floating gates to either the channel or the select gate of the word line. If erased to the select gate, as best seen in the cell of FIG. 4, the dielectric between the floating gate edge 103 and the select gate 99 is preferably a thin layer of oxide that has been grown on the floating gate edge and through which electrons tunnel when appropriate voltages are placed on the various elements of the cell. The same is provided between the floating gate edge 105 and the select gate 99. If the cell is designed to be erased to the channel, the dielectric between the edges of the floating gates and the select gate may be made thicker and of a type that reduces the coupling between them. The dashed lines of FIG. 5 illustrate the coupling that exists when erasing to the select gate.

If the cells are to be erased to the channel, the embodiment of FIGS. 2–4 is modified somewhat. First, the dielectric between the select gate 99 and the adjacent floating gate edges 103 and 105 is made to be thicker to prevent erasing of the floating gates to the select gate. Second, the thickness of the gate dielectric between an underside of the floating gates and the substrate surface 47 is made thinner, such as about 100 Angstroms, to facilitate electrons tunneling through it. Third, the cells to be simultaneously erased as a block are grouped together and isolated on the substrate from other blocks. This is typically done by a triple well process, where an n-well is formed in a p-substrate, and a p-well carrying the block of cells is positioned within the n-well that isolates the block from others. An appropriate erase voltage is then applied to the p-wells of the blocks to be erased, while other blocks are not affected.

Another advantage of using the wider steering gates of the present invention, particularly when the floating gates are erased to the select gates of the word lines carrying a high voltage, is that the steering gates separate the word lines from the diffusions, thereby eliminating possible breakdown of a dielectric that exists between the word line and the diffusion in prior dual gate structures.

When designed to be erased to the select gate 99, care is taken to make sure that a resulting voltage gradient across the gate dielectric between the select gate and the substrate surface 47 remains sufficiently below a breakdown level of that dielectric. This is a concern because the word line is typically raised to a level in excess of 10 volts and sometimes to 20 volts or more during erase, while other voltages applied to the cell are usually 5 volts or less. The voltage gradient across the select gate dielectric can be reduced by making it thicker or selected to have a dielectric constant that is higher than normally used but that can adversely affect operation of the select transistor. However, as part of the present invention, the cell may be operated with a lower voltage difference between the select gate and the substrate during erase. This is accomplished by raising all of the source and drain diffusions (bit lines) of a portion of the array to be erased to a positive voltage, rather than maintaining them at ground potential as is presently most common, thus reducing the voltage differential between the select gates of the word lines and the substrate channel regions during an erase operation.

Application of a positive voltage to the source and drain of a cell during erase has two effects. Initially, before erasure of the floating gates has commenced, the L1 portions of the cell's channel under the floating gates is rendered non-conductive. Thus, the middle L2 portion of the channel under the select gate is isolated from connection with either the source or the drain. The voltage of the select transistor channel portion L2 is pulled upward as a result of its capacitive coupling with the select gate that carries a high voltage during erase. At some point in the process of electrons being removed from a floating gate to the select gate, its channel portion will switch from being non-conductive to being conductive. Thus, when this happens to either of the floating gates, the middle channel portion under the select gate is then connected to the potential of one of the source or drain. But since that voltage is positive, the voltage difference between the select gate, that carries the high erase voltage and the channel portion under the select gate is lower than in the case where the source and drain are maintained at zero volts during erase. The maximum voltage across the select gate dielectric during erase is reduced, and the highest such voltage occurs for only a portion of the erase cycle after one or both of the channel portions under the floating gates has been rendered conductive.

The wider steering gates also help make the reduced select transistor gate dielectric voltage possible because they increase the proportion of the floating gates' coupling with the steering gates vs. that with the substrate channel and word line, so an increase of the substrate channel voltage, which results from the positive source and drain potentials during erase, is not translated into a very significant increase of the floating gate voltage. The steering gates, when maintained at ground potential, for example, are better able to hold their floating gates near ground because of this increased capacitive coupling. Since there is some degree of coupling between the substrate channel and the floating gates, and because increasing the voltages on the diffusions places added strains on other dielectrics and junctions, there is a limit of how high this voltage can be made. In the examples herein, the word line is raised to about 20 volts and the bit line diffusions to about 5 volts during erase. The result of reducing the voltage differential between the select gate and the substrate channel is to reduce the degree to which some characteristic of the select gate dielectric must be altered (such as its thickness or composition) from what is optimal for operation of the select transistor.

Second Memory Cell Array Embodiment

Figure 6:
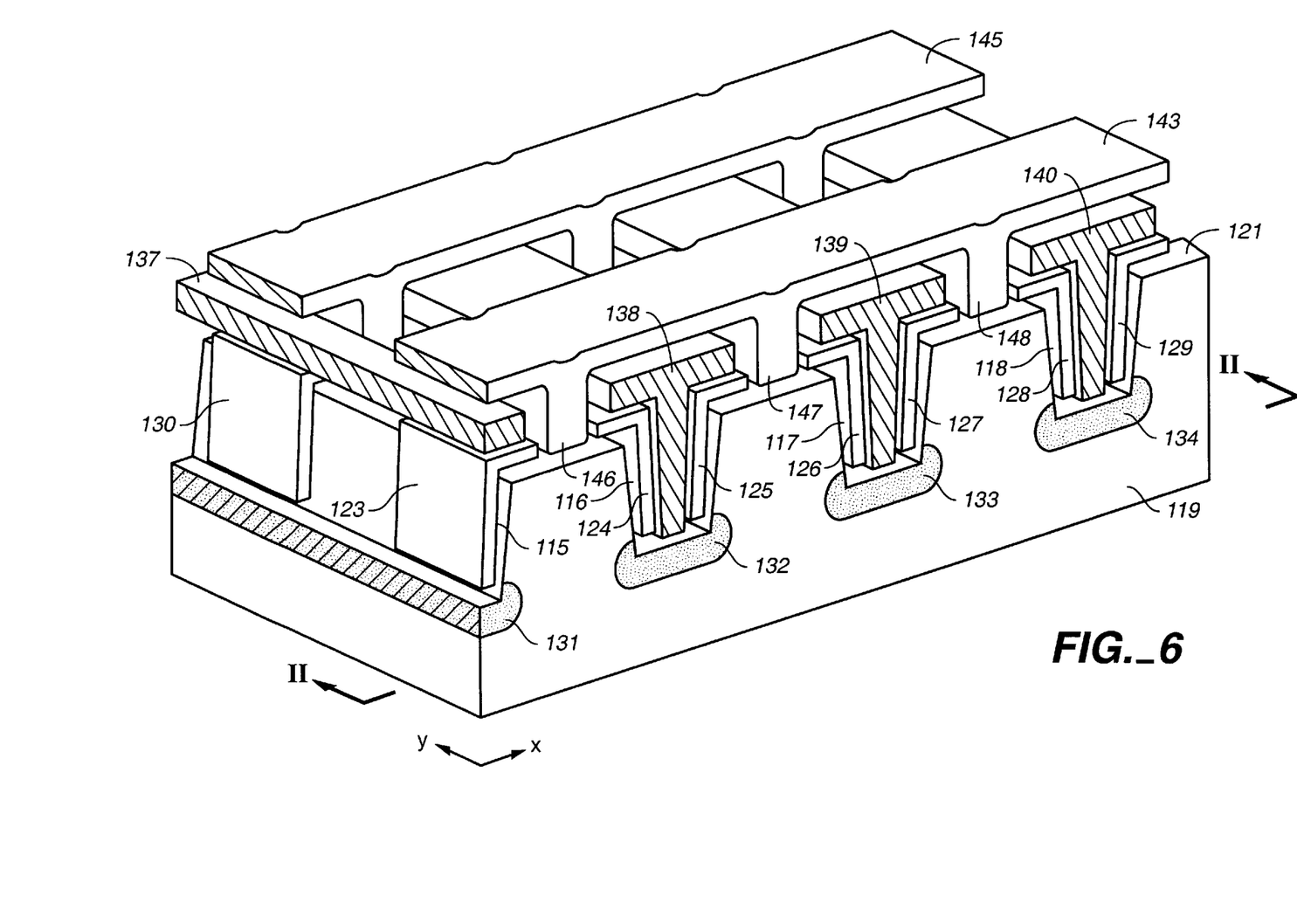
FIG. 6 is an isometric view of a second embodiment of a memory cell array of present invention.
Figure 7:
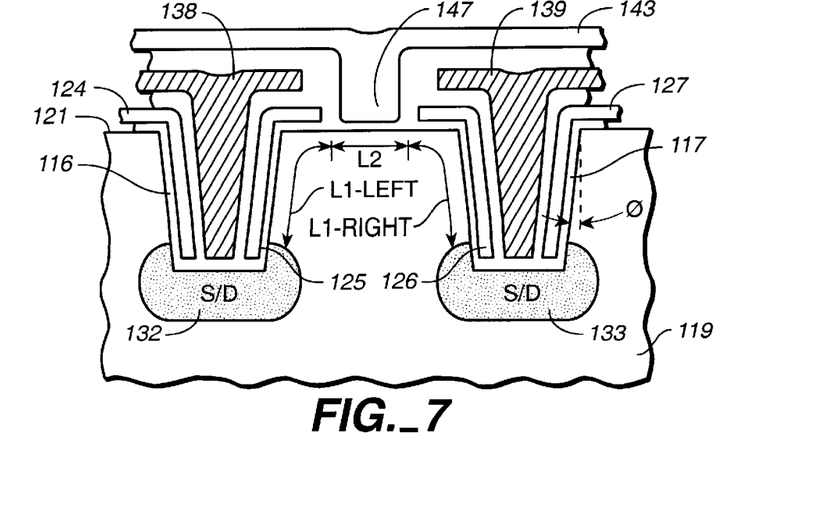
FIG. 7 is a cross-sectional view of the memory cell array of FIG. 6, taken at section II—II thereof.

According to another aspect of the present invention, the amount of area taken by each cell can be further reduced by taking advantage of the feature of adjacent floating gate columns sharing a common steering gate. Because of this configuration, the first embodiment of FIGS. 2–4, wherein the floating gates are arranged in a plane parallel to the planar surface of the substrate, can be modified to place a majority of the floating gates along opposing sides of a trench with the common steering gate positioned between them. An example of such a modified structure is illustrated in FIGS. 6 and 7. In this second embodiment, the cells are horizontally compacted in the x-direction by extending the floating gates down into trenches in the substrate. This configuration also allows the floating gates to be made larger in effective length without increasing the horizontal (x-direction) extent of the dual floating gate memory cell, since the floating gates are extended downward into the trenches, thus increasing the density of the floating gates and consequently of the data stored in an array of a given area for floating gates of a given length.

In the portion of an array according to the second embodiment shown in FIGS. 6 and 7, trenches 115–118 are formed in a planar top surface 121 of a semiconductive substrate 119. The trenches are elongated in the y-direction across the substrate, are parallel with each other and are spaced apart in the x-direction. It is preferable, in order to minimize the size of each cell, that the side walls of the trenches be perpendicular with the substrate surface 121 but this makes it difficult to form by present processing technology. Therefore, the trench walls are slightly tilted in the x-direction away from a center of the trench by an angle θ. The angle θ is made as small as possible, less than about 15 degrees, as permitted by the processing technology that forms the floating gates. The trenches are formed as an initial step by choosing an etching technology and materials to provide the trenches with the desired side wall angle θ.

After the trenches are formed, source and drain diffusions 131–134 are implanted in the bottom of the trenches and they subsequently diffuse outwardly and slightly up along the trench side walls. After the implant, a layer of floating gate oxide dielectric is formed over the structure, particularly along the side walls of the trenches. Floating gates 123–130 are then formed from a first doped polysilicon layer that is etched away through a mask to leave the floating gates isolated from one another. It is this etching step, which, for accurate dimensional control, is highly anisotropic, that is facilitated by the trench sidewalls having a slight angle θ from the vertical. It is then easier to remove all of the first polysilicon layer from the trench walls and bottom in between the areas of polysilicon that are desired to remain as the floating gates.

Although the trenches are illustrated in FIGS. 6 and 7 to extend continuously through multiple cells for at least a segment of the array, a series of separate trenches can alternately be formed in the y-direction, one trench for each cell. In this alternative arrangement, each trench is made to have a length in the y-direction that matches the dimension of the floating gate in that direction. Opposing end walls (not shown) in the y-direction are preferably also sloped in order to make it easier to remove some of the first polysilicon layer from those end walls. A single mask can be used to separate the first polysilicon layer into two floating gates in each trench and to subsequently implant the source and drain regions along lines extending through the trenches and between them.

After forming a suitable dielectric over the floating gates, steering gates 137–140 are formed by depositing a second layer of polysilicon to fill the spaces remaining in the trenches between the dielectric layers covering the floating gates. This also covers the top of the first polysilicon structure with the second polysilicon layer, which is then etched though a mask to form separate steering gates that are elongated in the y-direction. The first polysilicon layer strips are then etched, self-aligned with edges of the second polysilicon layer steering gates, to form isolated floating gate islands. As in the embodiment of FIGS. 2–4, each steering gate is capacitively coupled with adjacent floating gates of adjacent cells and extends across a diffusion that exists between the cells.

Word lines 143 and 145 are formed from a third polysilicon layer, with select gates extending downward as part of each word line polysilicon into each dual floating gate cell along its row. Select gates 146–148 are illustrated in FIGS. 6 and 7 as elements of three respective contiguous cells along a row. As best can be seen from the enlarged cell cross-sectional view of FIG. 7, a select transistor is formed in the channel region L2 on the surface 121 of the substrate 119 under the select gate 147. A left L1 channel region extends on one side of the region L2 to the diffusion 132, and a right L1 channel region extends on the other side of the region L2 to the diffusion 133. That is, each of the L1 channel regions includes a portion on the surface 121 and most of a sidewall of one of the trenches 116 and 117. The same considerations of erasing the floating gates of a cell to either the substrate 119 or to the select gate 147 that were discussed with respect to the first embodiment apply to this embodiment as well. For example, when the floating gates 125 and 126, shown in the enlarged memory cell view of FIG. 7, are erased to its select gate 147 through tunnel dielectric layers therebetween, the channel is advantageously raised in voltage when the high erase voltage is applied to the select gate in order to reduce stress on the select transistor dielectric between the select gate 147 and the substrate surface 121.

This second cell array embodiment also has the same advantages discussed above with respect to the first embodiment, except that the width of the steering gates will usually be a minimum feature size that the current processing techniques can implement. The advantages of facilitating future scaling of the circuit and making it easier to electrically contact the steering gates, as discussed above for the first embodiment, are thus reduced in the second embodiment. But the steering gates in the second embodiment do have an increased cross-section, with a resulting increased conductivity that reduces the frequency of the contacts that must be provided between the steering gates and metal conductors of another layer. And there are one-half the number of steering gates, thus requiring only one-half the number of metal conductors connected to them. The coupling between a floating gate and its steering gate is increased relative to the coupling between the floating gate and its word line and substrate, as in the first embodiment. The word lines and their select gates in the second embodiment are even further isolated from the diffusions than in the first embodiment since the diffusions are removed to the bottom of the trenches, in addition to interposing the select gates therebetween.

Cell and Array Operating Parameters

Figures 8, 9:
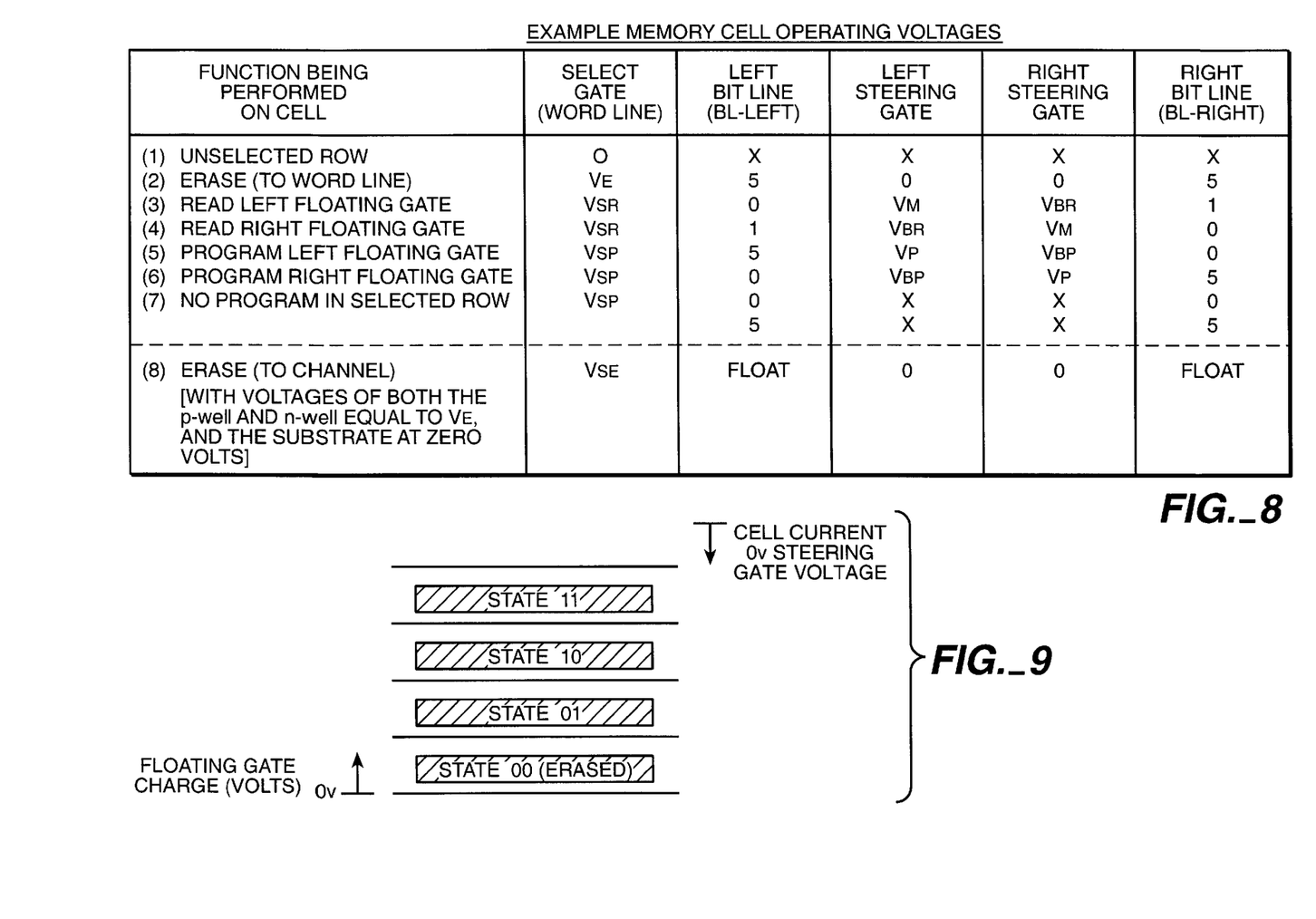
FIG. 8 is a table giving example voltages of one way to operate either of the first or second embodiments of the present invention.
FIG. 9 is a diagram showing an example of multiple states of operation of either of the first or second embodiments of the present invention.

Example operating voltages to program, read and erase the memory cells of the array of the first embodiment are given in a table of FIG. 8. Except where noted herein, the same operating voltages are applied to the cells of the array of the second embodiment. Lines (1)–(7) pertain to the operation of the type of cells that are erased to the select gates (word lines), while line (8) shows a modification for operating the type of cells that are erased to the substrate. In these examples, the substrate portion in which the cells are formed contains p-type doping and the bit line diffusions are of n-type. The substrate is held at ground potential throughout these operations.

In line (1) of the FIG. 8 table, the voltage conditions are given for a row that is not selected. The word line of an unselected row is placed at ground potential by the driver circuit 19 (FIG. 1). The "X" in the columns for the bit lines (diffusions) and steering gates of cells along an unselected row indicates that the voltages on those elements do not matter, a "don't care" situation. Since there are no negative voltages generated by any of the circuits 13, 19 and 21 for elements of the array, in this example, a zero voltage on the select gates of a row assures that none of the cells along that row are enabled. No current can flow through their channels. Programming or reading of other cells in the same columns of a different row can take place without affecting the row having a zero voltage on its word line.

The second line (2) of the FIG. 8 table gives an example set of voltages for erasing the type of cells designed to be erased to the word line's select gate. A high erase voltage $V_E$, in a range of 10–25 volts with 20 volts preferred, is applied by driver circuits 19 to all the word lines whose memory cell floating gates are to be erased. This is usually at least one defined block of cells including all cells in a large number of contiguous rows, in order to amortize the time of an erase operation over a very large number of memory cells. However, in applications where it is preferred, fewer cells may be simultaneously erased. The erase block can, alternatively, even be limited to a single row of cells. The steering gates of the cells along the one or more selected rows are set to a low voltage by the driving circuit 21, such as zero volts, in order to maintain, by the high degree of capacitive coupling between the steering and floating gates, the voltage of the floating gates at a low level. The resulting potential difference between the floating gates and their respective select gates (word lines) causes electron tunneling through the intermediate dielectric.

As discussed above, the bit line diffusions of all the cells being simultaneously erased are raised above zero by one or more volts by the driving circuit 13. This initially isolates the select transistor channel region L2 from connection with the voltage of the source and drain diffusions, and, as the floating gates become sufficiently erased, drives the voltage of the select transistor channel region to the increased voltage of its adjacent source or drain. This results in reducing the voltage across the select transistor gate dielectric. During erase, this increased voltage appearing in the floating gate channel regions from their adjacent source or drain also causes the voltage of the floating gate to be increased somewhat, thus diminishing the voltage difference between the floating and select gates, but this is acceptable in light of the advantages to the construction and operation of the select transistor that the higher substrate channel voltage brings about. In this example, 5 volts is applied to the bit line diffusions, which, as can be seen from the table of FIG. 8, is the highest voltage that is ever applied to the bit lines, during any operation. Consequently, this is the maximum voltage that the junctions formed by the diffusions with the substrate are designed to safely withstand, the substrate being held at ground potential during all operations. This limited required maximum voltage facilitates both the design of this junction and its scalability.

Lines (3) and (4) give example voltages for reading the state of the two floating gates of a memory cell, line (3) for the left floating gate and line (4) for the right floating gate. In each case, the cell is enabled by the select gate being raised to a voltage $V_{SR}$ sufficient to turn on the cell's select transistor to enable current flow through the channel. This voltage is typically one volt higher than the threshold of the select transistor, for example $V_{SR}=2$ volts for a select transistor floating gate to be read is held at zero volts, for optimal read precision, especially when used in conjunction with a multi-level storage operation, by minimizing additional coupling from the bit line to the floating gate being read. At the same time, the other bit line is given a level equal to an optimum sensing bias of the sense amplifier within the circuit 13 that is used in the reading process, such as one volt. The higher voltage on the bit line adjacent the floating gate not being read also assists in over driving that floating gate, further limiting its impact on sensing the charge level of the targeted floating gate.

As just mentioned regarding multi-level storage operation, although the state of the voltage of a selected floating gate can be programmed and read to be in one of just two states, thus storing one bit of information on each floating gate, resulting in two bits being stored in each memory cell, it is preferable to operate the memory system with more than two storage states per floating gate, thus storing more than one bit of information per floating gate and more than two bits per cell. FIG. 9 illustrates operating with a floating gate voltage window divided into four states, thus storing 2 bits per floating gate and 4 bits of information per memory cell. Operation with even more states is desirable to further increase the density of data that can be stored in a given memory cell array. For example, 16 state operation results in storing 4 bits of data per floating gate and 8 bits of information per memory cell.

When reading the voltage state of one floating gate, the steering gate over the floating gate being read has a voltage $V_M$ applied to it and the steering gate over the other floating gate of the cell is raised to $V_{BR}$, as shown in lines (3) and (4) of the table of FIG. 8. The voltage $V_{BR}$ is made to be high enough, an example being 8 volts, to render the cell's channel portion under the non-selected floating gate sufficiently conductive, no matter what the programmed state of the non-selected floating gate. To read the state of the selected floating gate, the voltage $V_M$ is scanned or stepped between two voltages during the reading step, and its value when the cell current passes through a defined threshold is detected by the sense amplifiers within the circuit 13. This detected value of $V_M$ is indicative of the state (FIG. 9) in which the selected floating gate has been programmed.

Example voltages for programming one floating gate of a dual floating gate cell are given in lines (5) and (6) of the table of FIG. 8. In order to select the cell for operation, the select gate is raised sufficiently to turn on the cell's select transistor. The voltage $V_{SP}$ may be different from the voltage $V_{SR}$ used during reading in order to optimize the source side injection programming speed. An example is $V_{SP}=2.2$ volts when the threshold of the select transistor is one volt. The bit line diffusion on the same side of the cell as the floating gate selected to be programmed is raised to a maximum bit line voltage, 5 volts in this example, during the programming operation. This voltage is made high enough to enable a high enough field to be built up across the gap between the floating and select gate channels to obtain source side hot electron programming. The bit line diffusion on the same side of the cell as the non-selected floating gate is held at zero volts during programming.

The steering gate over the non-selected floating gate is raised to a voltage $V_{BP}$ that is sufficient to render sufficiently conductive the channel region under the non-selected floating gate in order to pose no interference to programming of the target floating gate, no matter what floating gate voltage exists on the non-selected floating gate, within a programming window range of floating gate voltages. The voltage $V_{BP}$ is made higher than the voltage $V_{BR}$ used during reading in order to turn on that portion of the cell channel harder in light of higher voltages being applied to other elements of the cell. A voltage $V_P$ is applied to the steering gate over the selected floating gate with a level that drives the selected floating gate to a voltage that assists in creating the desired field conditions in the channel below it for hot electron programming. For example, the voltage $V_P$ within the range of 5–12 volts is suitable. This voltage may vary during the programming operation. Typically, the appropriate set of programming voltages is first applied to a erased cell, followed by the appropriate set of reading voltages, and, if the reading step does not indicate that the selected floating gate has been programmed to the desired voltage state, which may be the programming state for binary storage or one of the variable storage states for multi-level storage, programming voltages are again applied which may in part be different from the earlier set.

A last line (7) of the table of FIG. 8 shows voltages that are applied to those cells within a row selected for programming that are themselves not to be programmed. That is, the number of cells programmed at the same time within one row of a segmented portion of an array are spaced alternately along the row with other cells in between them that are not being programmed. It is these other cells not being programmed that receive the voltages of line (7) of the table of FIG. 8. The opposing bit line diffusions are maintained at the same voltage in order to prevent any current from flowing, in the channel, such as both zero or both 5 volts. As with the notation used in line (1), the "x" indicates that the voltages on the steering gates of these cells do not matter, in either case.

In the case of memory arrays designed to be erased to the substrate, erase voltage conditions of line (8) are applied instead of those of line (2). Both the p-well containing a block of cells to be erased and its surrounding n-well are raised to the erase voltage $V_E$, within an example range of 10–25 volts with 20 volts preferred. (During reading and programming such cells, their wells are held at ground potential.) A positive voltage $V_{SE}$ is preferably applied to the select gates during erase in order to reduce the voltage applied across the select gate dielectric, since an excessive voltage differential between the substrate and select gate can damage the dielectric material or cause it to be made thicker than otherwise desirable for operation of the cells. Since such a voltage is partially coupled from the select gates to the adjoining floating gates sought to be erased, it cannot be too high or else the voltage differential between the floating gates and the substrate channel, which is made high to effect the erase, is reduced too far. A range of $V_{SE}$ of from 3–12 volts is operable, depending upon the level of $V_E$, with $V_{SE}=10$ volts preferred when $V_E=20$ volts.

Figure 10:
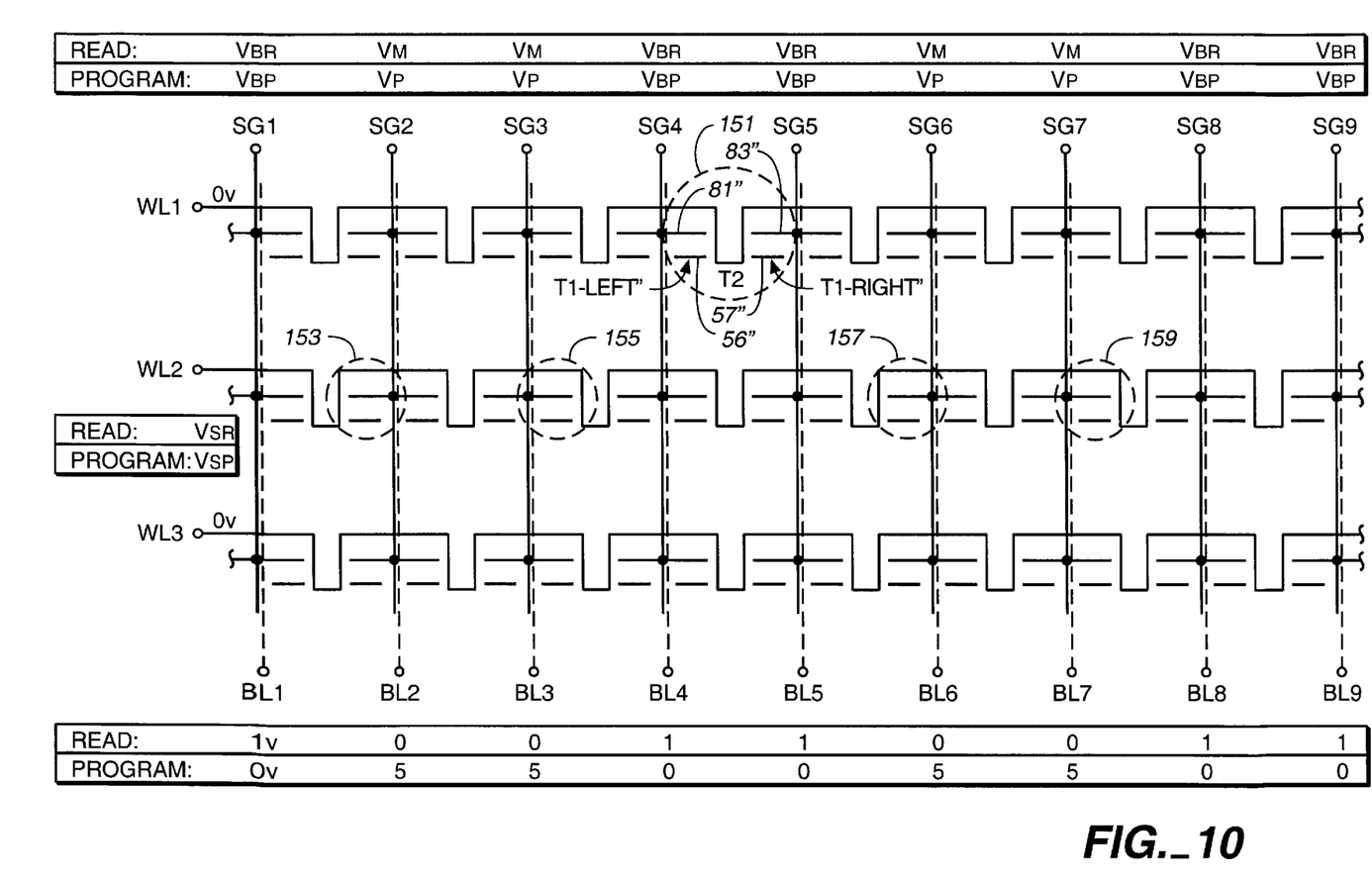
FIG. 10 is a schematic diagram of a portion of a memory cell array according to the present invention.

Referring to FIG. 10, the voltages of the table of FIG. 8 are shown applied to a portion of an array of memory cells, represented schematically, for simultaneously programming or reading the states of multiple floating gates along a selected row. Bit lines are labeled in FIG. 10 as BL1, BL2, etc., while steering gate connections are identified as SG1, SG2, etc. Word lines are denoted as WL1, WL2, etc. A typical cell 151 is labeled with the same reference numbers of the cell illustrated in FIGS. 4 and 5 but with a double prime (") added. An array of 3 rows and 8 columns of such cells are shown. Using the voltages of the table of FIG. 8, floating gates within cell halves 153, 155, 157 and 159 are either being read or programmed at the same time, depending upon whether the read or program voltages are being applied to the word lines, bit lines and steering gates. That is one floating gate from every other cell along the selected row. The remaining intermediate cells of the selected row have equal voltages applied to their bit lines, so no current flows through the channels of those cells. An entire row, or designated portion of a row, of cells may be read or programmed by a sequence of four simultaneous such operations. Alternatively, in order to reduce the power required for each read or to space the sense amplifiers further apart along the columns, one floating gate from every fourth cell along the selected row may be read, while the voltages of the bit lines of cells intermediate of those being read are made equal.

Although the various aspects of the present invention have been described with respect to certain preferred embodiments, it is understood that the invention is entitled to protection within the full scope of the appended claims.

It is claimed:

1. An array of non-volatile memory cells on a semiconductor substrate, comprising:

a two-dimensional array of floating gates arranged in rows extending in a first direction across the substrate with spaces therebetween and columns extending in a second direction across the substrate with spaces therebetween, said first and second directions being orthogonal with each other, a first set of spaces separating the columns of floating gates including ones of every other space across the substrate in the first direction and a second set of spaces separating the columns of floating gates including remaining ones of every other space across the substrate in the first direction in between the first set of spaces, elongated source and drain diffusions having lengths extending across the substrate in the second direction and spaced apart in the first direction coincident with the first set of spaces between the columns of floating gates, elongated steering gates having lengths extending across the substrate in the second direction, having widths individually extending across two adjacent columns of floating gates and positioned within the first set of spaces therebetween, and being spaced apart in the first direction with the second set of spaces between the columns of floating gates therebetween, and elongated select gates having lengths extending in the first direction along rows of floating gates, over steering gates and extending into said second set of spaces between adjacent columns of floating gates in the second set of spaces, said select gates being spaced apart in the second direction.

2. The memory cell array of claim 1, wherein the steering gates additionally extend into the first set of spaces between columns of floating gates in a manner to be capacitively coupled with the substrate therein.

3. The memory cell array of claim 1, wherein the floating gates are positioned on a flat surface of the substrate with gate dielectric layers therebetween.

4. The memory cell array of claim 1, wherein the floating gates are positioned along sidewalls of trenches formed into a surface of the substrate with gate dielectric layers therebetween, the source and drain diffusions are formed in the substrate at the bottom of the trenches, and the steering gates are positioned in the trenches between floating gates therein to have a vertical orientation with respect to the substrate surface.

5. The memory cell array of claim 1, wherein the floating gates are formed from a first layer of conductive material, the steering gates are formed from a second layer of conductive material, and the select gates are formed from a third layer of conductive material.

6. The memory cell array of any one of claims 1–5, wherein the select gates are individually capacitively coupled with edges of floating gates facing the second set of spaces through respective layers of tunnel dielectric positioned therebetween, thereby to allow erasure of charge from the floating gates to the select gate through the tunnel dielectric.

7. The memory cell array of claim 6, which additionally comprises a control circuit connected to the source and drain diffusions, steering gates and select gates to program selected ones of the floating gates by injecting electrons from the substrate onto the selected floating gates and erasing the selecting floating gates by removing electrons through the tunnel dielectric.

8. The memory cell array of claim 7, wherein said control circuit additionally programs the selected floating gates into a selected one of more than two states, thereby to store more than one bit of data per floating gate.

9. The memory cell array of any one of claims 1–5, which additionally comprises a control circuit connected to the source and drain diffusions, steering gates and select gates to individually program the floating gates into a selected one of more than two states, thereby to store more than one bit of data per floating gate.

10. An array of non-volatile memory cells on a semiconductor substrate, comprising:

elongated source and drain diffusions being spaced apart in a first direction across the substrate and having lengths extending in the second direction across the substrate, said first and second directions being orthogonal with each other, a plurality of memory cells organized in a plurality of rows that extend in the first direction across the substrate and are spaced apart in the second direction, said memory cells individually including floating gates capacitively coupled with the substrate through gate dielectric layers over first and second channel regions positioned adjacent opposing diffusions with a third channel region therebetween, a plurality of elongated steering gates having lengths extending in the second direction, said steering gates being individually positioned in the first direction to overlay adjacent floating gates of adjacent memory cells and a diffusion therebetween, and having spaces therebetween in the first direction that includes the third channel region, and a plurality of elongated select gates having lengths extending in the first direction along the rows of memory cells and being capacitively coupled with the substrate in the third channel region.

11. The memory cell array of claim 10, wherein said steering gates extend over edges of said adjacent floating gates that face each other across the diffusions, and farther wherein the steering gates are positioned between the floating gates and the select gates.

12. The memory cell array of claim 11, wherein said steering gates are capacitively coupled through a dielectric layer with the substrate over the diffusions located between said adjacent floating gates.

13. The memory cell array of claim 10, wherein the floating gates are positioned alone sidewalls of trenches formed into a surface of the substrate with the gate dielectric layers therebetween, the source and drain diffusions are formed in the substrate at the bottom of the trenches, and the steering gates are positioned in the trenches between floating gates therein to have an orthogonal orientation with respect to the substrate surface.

14. The memory cell array of claim 10, wherein the floating gates are formed from a first layer of conductive material, the steering gates are formed from a second layer of conductive material, and the select gates are formed from a third layer of conductive material.

15. The memory cell array of any one of claims 10–14, wherein the select gates are individually capacitively coupled with edges of the floating gates adjacent the third channel regions through respective layers of tunnel dielectric positioned therebetween, thereby to allow erasure of charge from the floating gates to the select gate through the tunnel dielectric.

16. The memory cell array of claim 15, which additionally comprises a control circuit connected to the source and drain diffusions, steering gates and select gates to program selected ones of the floating gates by injecting electrons from the substrate onto the selected floating gates and erasing the selecting floating gates by removing electrons through the tunnel dielectric.

17. The memory cell array of claim 16, wherein said control circuit additionally programs the selected floating gates into a selected one of more than two states, thereby to store more than one bit of data per floating gate.

18. The memory cell array of any one of claims 10–14, which additionally comprises a control circuit connected to the source and drain diffusions, steering gates and select gates to individually program the floating gates into a selected one of more than two states, thereby to store more than one bit of data per floating gate.

19. A non-volatile memory cell formed on a semiconductor substrate, comprising:

source and drain diffusions in a surface of the substrate that are spaced apart to form a channel having three non-overlapping regions extending in a given direction therebetween, a first floating gate positioned over a first of the channel regions and extending in said given direction a part way over an adjacent source diffusion with a first floating gate dielectric layer area positioned between the first floating gate and the substrate surface, a second floating gate positioned over a second of the channel regions and extending in said given direction a part way over an adjacent drain diffusion with a second floating gate dielectric layer area positioned between the second floating gate and the substrate surface, a first steering gate positioned over the first floating gate and extending in said given direction over the source diffusion and an edge of the first floating gate adjacent the source diffusion but not over an edge of the first floating gate adjacent the third channel region, said first steering gate being separated from the first floating gate and the source diffusion by a first steering gate dielectric layer, a second steering gate positioned over the second floating gate and extending in said given direction over the drain diffusion and an edge of the second floating gate adjacent the drain diffusion but not over an edge of the second floating gate adjacent the third channel region, said second steering gate being separated from the second floating gate and the drain diffusion by a second steering gate dielectric layer, a select gate positioned over a third of the channel regions in between the first and second channel regions with a first select gate dielectric layer area positioned between the select gate and the substrate surface, said select gate being coupled with the edges of the first and second floating gates adjacent the third channel region through respective layers of tunnel dielectric positioned therebetween, thereby allowing the floating gates to be erased to the select gate, said select gate additionally extending over the first and second steering gates with respective second and third layers of select gate dielectric positioned therebetween.

20. The memory cell of claim 19, wherein the first and second steering gate dielectric layers are characterized by providing capacitive coupling between the respective first and second steering gates and the respective source and drain diffusions.

21. The memory cell of either of claims 19 or 20, wherein the first and second floating gates are formed from a first layer of conductive material, the first and second steering gates are formed from a second layer of conductive material, and the select gate is formed from a third layer of conductive material.

22. A non-volatile memory cell structure, comprising:

a semiconductor substrate having an outer surface, a plurality of trenches spaced apart in a given direction across said outer surface, said trenches individually having a cross-section in said given direction that extends into the outer surface with opposing substrate sides and a bottom substrate surface, said trenches individually including:

a diffusion in the substrate at the bottom the trench, a pair of floating gates positioned along the opposing substrate sides of the trench with floating gate dielectric therebetween and extending out of the trenches to terminate in said given direction with edges on the outer substrate surface on opposite sides of the trench, individual pairs of floating gates being separated a space in said given direction over the diffusion, and a single steering gate positioned between the floating gates and capacitively coupled therewith through steering gate dielectric layers on opposite sides of the steering gate in said given direction, and a plurality of select gates capacitively coupled through select gate dielectric layers to the substrate outer surface adjacent said floating gate edges.

23. The memory cell structure of claim 22, wherein said select gates are capacitively coupled with the floating gate edges through layers of tunnel dielectric positioned therebetween, thereby allowing the floating gates to be erased to the select gate.

24. The memory cell structure of claim 23, wherein the steering gate in the individual trenches extends into the space between the floating gates and is capacitively coupled with the substrate diffusion at the bottom of the trench through a trench bottom dielectric layer.

25. The memory cell structure of either of claims 22 or 23, wherein the floating gates are formed from a first layer of conductive material, the steering gates are formed from a second layer of conductive material, and the select gates are formed from a third layer of conductive material.

26. A non-volatile memory system, comprising:
an array of memory cells on a semiconductor substrate, said array including:
elongated source and drain diffusions being spaced apart in a first direction across the substrate and having lengths extending in the second direction across the substrate, said first and second directions being orthogonal with each other,
a plurality of memory cells organized in a plurality of rows that extend in the first direction across the substrate and are spaced apart in the second direction, said memory cells individually including floating gates capacitively coupled with the substrate through gate dielectric layers over first and second channel regions positioned adjacent opposing diffusions with a third channel region therebetween,
a plurality of elongated steering gates having lengths extending in the second direction, said steering gates being individually positioned in the first direction to overlay adjacent floating gates of adjacent memory cells and a diffusion therebetween, and having spaces therebetween in the first direction that includes the third channel region, and
a plurality of elongated select gates having lengths extending in the first direction along the rows of memory cells and being capacitively coupled with the substrate in the third channel region, and
a word line decoding and voltage supply circuit connected to drive the select gates of the memory cells of individual rows to at least a first word line voltage level that prevents current from flowing through the third channel region of the memory cells in unselected rows and a second word line voltage level that allows current to flow through the third channel region of the memory cells of the selected rows,
a steering gate decoding and voltage supply circuit connected to individually drive selected steering gates to at least one first steering gate voltage level that renders conductive the first channel region of one memory cell and the second channel region of an adjacent memory cell for an operating range of levels of charge carried by the floating gate s that are respectively capacitively coupled therewith, at least one second steering gate voltage level for reading a state of the floating gate capacitively coupled with the first channel region of one memory cell or the floating gate capacitively coupled with the second channel region of an adjacent memory cell, and at least one third steering gate voltage level for programming a state of the floating gate capacitively coupled with the first channel region of one memory cell or the floating gate capacitively coupled with the second channel region of an adjacent memory cell, and a bit line decoding and voltage supply circuit connected to drive the source and drain diffusions of individual columns of cells to at least a first condition wherein the source and drain diffusions of a column of memory cells selected for reading or writing have unequal voltages and a second condition wherein the source and drain diffusions of a column of memory cells not selected for reading, or writing have equal voltages.

27. The memory system of claim 26, wherein the memory cell array additionally includes the select gates being individually capacitively coupled with edges of the floating gates adjacent the third channel regions through respective layers of tunnel dielectric positioned therebetween, thereby to allow erasure of charge from the floating gates to the select gate through the tunnel dielectric, wherein the word line decoding and voltage supply circuit is additionally connected to drive the select gates of the memory cells of at least one row of cells to be erased to a third word line voltage level that is significantly higher than the first and second word line voltages, and wherein the bit line decoding and voltage supply circuit is further connected to drive the source and drain diffusions of individual columns in which memory cells of said at least one row of cells to be erased to a third condition during an erase operation of voltages of at least one volt.

28. The memory system of claim 26, wherein the bit line decoding and voltage supply circuit and the steering gate decoding and voltage supply circuit are additionally connected to either simultaneously read or program one floating gate of alternate cells along a row of cells that is selected by the word line decoding an voltage supply circuit, whereby four such operations may read or program the cells in the selected row.

29. The memory system of any one of claims 26–28, wherein the memory cell array additionally includes the floating gates being positioned along sidewalls of trenches formed into a surface of the substrate with the gate dielectric layers therebetween, the source and drain diffusions are formed in the substrate at the bottom of the trenches, and the steering gates are positioned in the trenches between floating gates therein to have an orthogonal orientation with respect to the substrate surface.

30. The memory system of claim 29, wherein the steering gate decoding and voltage supply circuit is connected to drive selected steering gates to the at least one of the second and third steering gate voltage levels that programs the selected floating gates into a selected one of more than two states, thereby to store more than one bit of data per selected floating gate.

31. The memory system of any one of claims 26–28, wherein the steering gate decoding and voltage supply circuit is connected to drive selected steering gates to the at least one of the second and third steering gate voltage levels that programs the selected floating gates into a selected one of more than two states, thereby to store more than one bit of data per selected floating gate.

* * * * *